United States Patent
Zhong et al.

(10) Patent No.: US 9,343,463 B2
(45) Date of Patent: May 17, 2016

(54) METHOD OF HIGH DENSITY MEMORY FABRICATION

(75) Inventors: Tom Zhong, Saratoga, CA (US); Adam Zhong, Milpitas, CA (US); Wai-Ming J. Kan, San Ramon, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 393 days.

(21) Appl. No.: 12/586,900

(22) Filed: Sep. 29, 2009

(65) Prior Publication Data

US 2011/0073917 A1     Mar. 31, 2011

(51) Int. Cl.
| | |
|---|---|
| *H01L 29/66* | (2006.01) |
| *H01L 21/4763* | (2006.01) |
| *H01L 27/105* | (2006.01) |
| *H01L 21/768* | (2006.01) |
| *H01L 23/522* | (2006.01) |
| *H01L 27/22* | (2006.01) |

(52) U.S. Cl.
CPC .......... *H01L 27/105* (2013.01); *H01L 21/7684* (2013.01); *H01L 21/76819* (2013.01); *H01L 23/522* (2013.01); *H01L 27/228* (2013.01); *H01L 2924/0002* (2013.01)

(58) Field of Classification Search
USPC .......................................... 257/499, E21.575
See application file for complete search history.

(56) References Cited

U.S. PATENT DOCUMENTS

| | | | |
|---|---|---|---|
| 5,850,366 A | 12/1998 | Coleman, Jr. | |
| 6,380,087 B1 | 4/2002 | Gupta et al. | |
| 6,828,240 B2 | 12/2004 | Hellig et al. | |
| 7,009,273 B2 | 3/2006 | Inoh et al. | |
| 2005/0026341 A1* | 2/2005 | Nuetzel | 438/197 |
| 2005/0127519 A1* | 6/2005 | Scheuerlein et al. | 257/773 |
| 2008/0225576 A1 | 9/2008 | Zhong et al. | |
| 2009/0194768 A1 | 8/2009 | Leedy | |

OTHER PUBLICATIONS

International Search Report PCT/US 10/02615 Mail date—Nov. 18, 2010, Magic Techologies, Inc.

* cited by examiner

*Primary Examiner* — Ori Nadav
*Assistant Examiner* — Vernon P Webb
(74) *Attorney, Agent, or Firm* — Saile Ackerman LLC; Stephen B. Ackerman

(57) ABSTRACT

The structure and method of formation of an integrated CMOS level and active device level that can be a memory device level. The integration includes the formation of a "super-flat" interface between the two levels formed by the patterning of a full complement of active and dummy interconnecting vias using two separate patterning and etch processes. The active vias connect memory devices in the upper device level to connecting pads in the lower CMOS level. The dummy vias may extend up to an etch stop layer formed over the CMOS layer or may be stopped at an intermediate etch stop layer formed within the device level. The dummy vias thereby contact memory devices but do not connect them to active elements in the CMOS level.

4 Claims, 5 Drawing Sheets

METHOD OF HIGH DENSITY MEMORY FABRICATION

BACKGROUND OF THE INVENTION

1. Field of the Invention

This invention relates generally to the fabrication of memory arrays. In particular, the invention relates to a method of forming a highly planar surface through whose use the process of integrating CMOS metal layers and memory junction layers will be improved.

2. Description of the Related Art

For most non-volatile memory fabrication processes, one of the main challenges is to connect the memory junction layer (the layer containing the memory devices) to a CMOS metal layer below it. The critical junction layer of non-volatile memory is normally placed above many metal layers. Depending upon the particular circuit design, there is at least one and perhaps as many as five layers of metal below the memory junction layer. New memory types, such as field induced MRAM (external magnetic fields used to change device magnetizations) and spin torque transfer memory (device magnetizations changed by the torque of conduction electrons) require the critical junction layer to be processed at the back-end of the line due to the anneal temperature limitation. For all known films (layer depositions) thus far the signal budget is very tight for any production-worthy processes. The requirement for CD budget for the junction layer is very tight across a device array (<2.0% 1 s). To achieve this kind of CD control, it will require a super-flat under-layer surface for the junction layer to be built upon.

As more and more back-end metal layers are built on a wafer, the global and local wafer flatness and warpage deteriorate significantly due to the built-in stress and process variations. In addition, the back end of line processes normally consist of Cu CMP (chemical mechanical polishing) processes. In each metal layout, there are normally many Cu lines and vias on the same layer. This kind of layout is normally difficult for the CMP process to planarize across the wafer surface. The following figures will schematically illustrate the prior art methodology for integration of a CMOS metal layer with an MTJ memory cell (or other similar circuitry that includes integrated active devices) formed above it.

Referring to FIG. 1a, there is shown schematically an overhead view of an exemplary layout (100) of metal (conducting) lines (10), and metal studs (20), surrounded by dielectric layers (210), that would typically be presented as the uppermost surface of a lower CMOS integrated circuit level. The studs provide the prepared sites for making the required interconnections between the CMOS circuit level and individual memory cell devices to be formed in a device level above the CMOS level. In the discussions that follow, these studs may also be denoted as "connection pads", which denote the same type of structures at which connections between CMOS circuitry and active devices are to be made. It is the task of circuit integration to fabricate the additional levels of active device circuitry on this CMOS level layout so that the additional levels of active circuitry are properly integrated with the CMOS circuitry through contact to the CMOS studs and connection pads.

FIG. 1b is a schematic view of a cross-sectional cut through the circuit of FIG. 1a through the horizontal line labeled 1b. The cut provides a cross-sectional view of the two lines (10), two of the studs (20) and the dielectric material (210) surrounding them. It is understood that there may be many more CMOS levels beneath this level, but for the purposes of describing the invention herein, it is only necessary to deal with that portion of the CMOS level that is in immediate contact with the device level formed above it.

Referring now to FIG. 2a, there is shown an overhead schematic view of a more realistic prior art layout of CMOS lines and studs (shown below in FIG. 2b) on which has been indicated an array of twelve exemplary "objects," presented as four columns of three objects in a column. This circuit is similar to that in FIG. 1a, but it has these additional objects that include the active devices and non-active elements that are used to improve the structural qualities of the circuit. In addition, this circuit includes the deposition and patterning of buffer layers (60) of conducting material that are formed over the Cu material ((10), and (20) in FIG. 2b) of the CMOS level. The buffer layers are for the purpose of preventing diffusion of Cu into the device level and to present a smooth surface on which to form the devices. All devices will be formed on these buffer layers.

In order to discuss the structure of these exemplary objects and the roles they play, they are labeled A through L. Objects A, B, G, H and I, that are shown as ellipses with large X's drawn within them, are actually not physical objects, but are regions where devices could be placed to improve the integrity of the circuit, but are not so placed. Objects (A and B) and (G, H and I) are positioned, respectively, on rectangular buffer layers (60) formed contiguously over Cu wiring (10) and (11) in the CMOS level that are shown in FIG. 2b. (C, D, E, F) and (J, K and L) are positioned over (shaded) dielectric regions (210) in the CMOS level. There is no large buffer layer formed contiguously over these dielectric regions, rather small individual circular buffer layers (60), shown as annular regions, are formed beneath junction devices of smaller radii.

E, F, J and K, in this exemplary circuit, label real studs that connect to the CMOS level. They are covered with circular patterned buffer layers (60) shown as small annular regions extending beyond the circular peripheries of junction devices (50) that are formed on these buffer layers. Junction devices formed on the real studs E, F, J and K are "active" junctions because they are electrically connected to the studs in the CMOS level. C, D and L are real junctions that are formed on circular buffer layers, but, in this exemplary circuit, there are no studs beneath them. These junctions are, therefore, called "dummy" junctions, because they have no electrical activity. They are formed to provide structural stability to the circuit. Dummy junctions are drawn with dashed circular peripheries to indicate their lack of activity. For performance purposes, we are supposing that active devices are not needed at locations A, B, G, H and I. For structural purposes, however, it would be desirable to form them there. Unfortunately, if they were formed there, they would be rendered active by contact with the Cu wiring beneath them, so they are "not allowed," and are not formed.

A "dummy" stud is a region in the CMOS level over which a memory junction is formed but under which there is no actual stud. Thus, the memory junction is fully formed, but does not act because it is electrically isolated from elements in the CMOS level. The non-existent dummy stud is shown as an annular region (30) drawn with a dashed line around a memory junction (70), also drawn with a dashed outline to indicate its inactivity.

Each stud, active and dummy, has a memory junction (or other like device) formed upon it. The memory junction is not formed directly on the stud, but is formed on a buffer layer that is deposited on the stud to control diffusion from the Cu forming the stud into the devices formed on the stud. These buffer layers are deposited and patterned and the devices are formed on them. The buffer layer formation will be discussed more fully below.

The memory junction is formed in the upper device layer that is integrated with the lower CMOS layer. The active studs have active junctions (50), formed on them. The dummy studs have dummy (inactive) junctions (70) formed on them. In addition, there are regions where dummy studs (75) should exist, but are not allowed (drawn with large elliptically surrounded X's). Dummy studs (A, B, G, H, I) and inactive devices on them are not allowed in regions where there is already a Cu line beneath a buffer layer, as lines (10) and (11). As previously mentioned, the fabrication of the studs includes the formation of a buffer conduction layer (60) that both prevents Cu diffusion into the surrounding materials and facilitates the smooth deposition of the memory junction layers to be formed in the upper device level. This second role of the buffer layer is required because the upper surface of the Cu conduction line deposition is typically too rough for effective formation of a memory device directly upon it. The nature of this fabrication is such that buffer layers may be formed in different sizes, such as the large rectangular layer beneath A, B, G, H and I and the smaller circular layers beneath E and K. It is difficult to smoothly pattern buffer layers in different sizes and designs and, in addition, large regions of buffer layer are prone to peeling during annealing.

Referring now to schematic FIG. 2b, there is shown a cross-sectional cut through the dashed line labeled 2b in FIG. 2a, showing two of the active memory junctions (50) formed on the buffered conduction layer (60) and contacting the active studs (20).

Several issues arise in the context of this type of fabrication as was already mentioned above. First, there is very little flexibility in the formation of a junction layer dummy pattern layout. Second, it is very difficult to form a flat and smooth buffer layer on the same fabrication surface when different pattern sizes are required. Third, a large buffer layer pattern is prone to peeling during annealing of the device structures. It would be advantageous to produce a fabrication in which the patterned layers of buffer material were both small and uniform.

Referring next to FIG. 3a, there is shown a schematic overhead view of another prior art fabrication and, in FIG. 3b, there is shown a schematic side view of a vertical cut through the line labeled 3b of the fabrication in FIG. 3a. The overhead view in 3a shows the buffer layers (60) and active (50) and dummy (70) devices. Note that the dummy devices are drawn with broken line peripheries to more clearly indicate that they are not connected to any electrical portions of the CMOS layer.

An observation of the side view in FIG. 3b shows that in this fabrication, a device layer level with additional structure (200) has been formed over the CMOS level (100). The device level, which may be called a via connection layer (VAC layer), includes dielectric material depositions (215) formed over an etch-stop layer (95) that caps the CMOS level. There can be seen both active devices (50), and inactive dummy devices (70). The active devices are formed on a buffer layer (60) and are connected to the CMOS level through vias (80), formed as part of this via connection layer. The dummy devices are left unconnected to the lower CMOS level and are now separated from the lower level by the thickness of the dielectric layer (215). Thus, because they would not directly contact a Cu layer in the CMOS level, these dummy devices are allowed, unlike the dummy devices in FIG. 2a that were not allowed (A, B, G, H and I in FIG. 2a).

The fabrication of FIG. 3a also has integration difficulties associated with it, particularly a difficulty in fabricating a flat, smooth VAC layer without properly filled dummy patterns and a difficulty in patterning a flat/smooth buffer layer due to the VAC underlayer.

Issues involving surface planarity have been discussed in the prior art. Inoh et al. (U.S. Pat. No. 7,009,273) discloses a dummy pattern formed at the ends of a DRAM array so that photolithograpy or etching processes will not vary.

Zhong et al., (US Patent Application 2008/0225576) discloses dummy MTJ devices to eliminate delamination during CMP. This patent application is assigned to the same assignees as the present invention.

Coleman (U.S. Pat. No. 5,850,366) teaches the formation of a memory array using dummy cells to provide a reference voltage.

None of this prior art addresses the problem of surface planarity in the manner of the present invention.

SUMMARY OF THE INVENTION

A first object of this invention is to provide an integration scheme for the integration of a CMOS level and a device level.

A second object of this invention is to provide such a scheme where there is an improved solution of problems associated with the metal layer connections between the CMOS level and the device level, particularly interfacial flatness between the two levels and difficulties in producing buffer layer patterns of different sizes.

A third object of the present invention is to provide an integration scheme that relaxes pattern size and distribution constraints on the CMOS metal layer layout.

A fourth object of the present invention is to provide such a method where the devices are memory junction (MRAM) devices.

A fifth object of the present invention is to provide such a scheme that improves the memory junction layer CD control.

These objects will be realized by a scheme that fabricates a uniform array of active and dummy devices and vias and, thereby, constructs a super-flat surface on the CMOS level on which to fabricate a device level, or more specifically, the MRAM junction level. The resulting device junction layer will have a layout including a segmented memory array surrounded by dummy devices that are formed on uniformly patterned buffer layers. The device junction layer will be constructed using a double pattern process that forms an evenly distributed array and dummy patterns for the super-flat layer process without limiting the under-metal layout.

DESCRIPTION OF THE PREFERRED EMBODIMENTS

The preferred embodiments of the present invention are two methods of integrating a CMOS level and an active device level, which in these embodiments is a memory device level, across a super-flat intermediate surface. The method is to split the formation of active interconnecting vias and dummy non-interconnecting vias into two different mask patterning steps. The etch that forms dummy vias will be stopped at one of two possible etch-stop layers formed above the lower CMOS metal layers while the etch to form the active interconnecting vias will penetrate the etch stop layer over the CMOS level and electrically connect to the metal layers below.

Figure 2A:
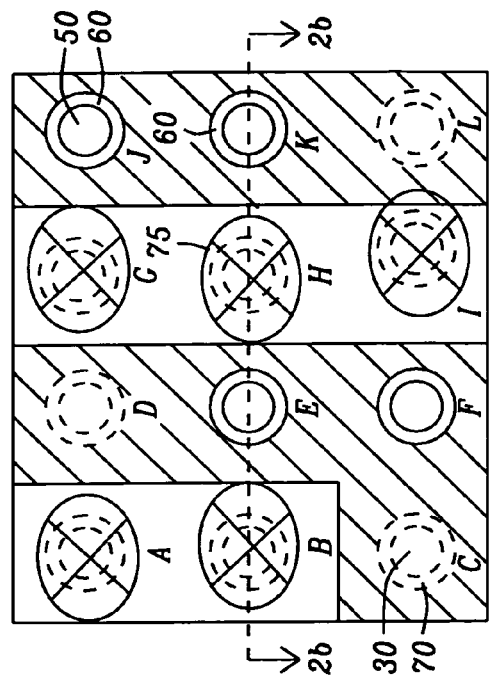
FIG. 2a and FIG. 2b are schematic illustrations of an overhead and side view of an alternative prior art CMOS/device layer interface showing the effect of dummy devices and buffer layer constructions.
Figure 2B:
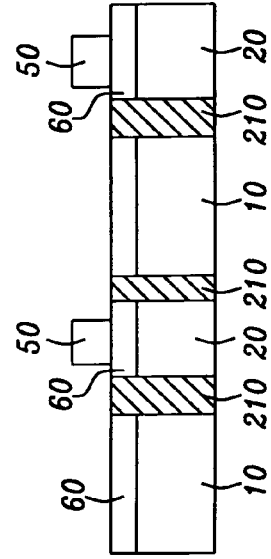
Figure 1A:
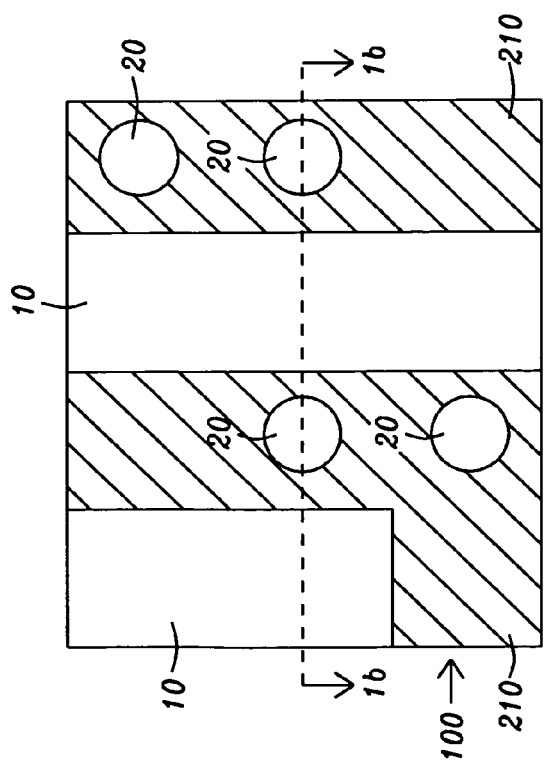
FIG. 1a and FIG. 1b are schematic illustrations of an overhead and side view of a prior art CMOS/device layer interface.
Figure 1B:
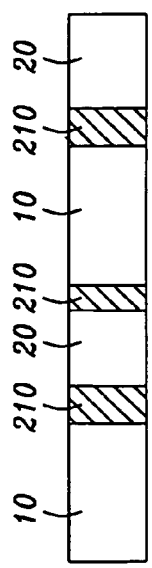
Figure 3A:
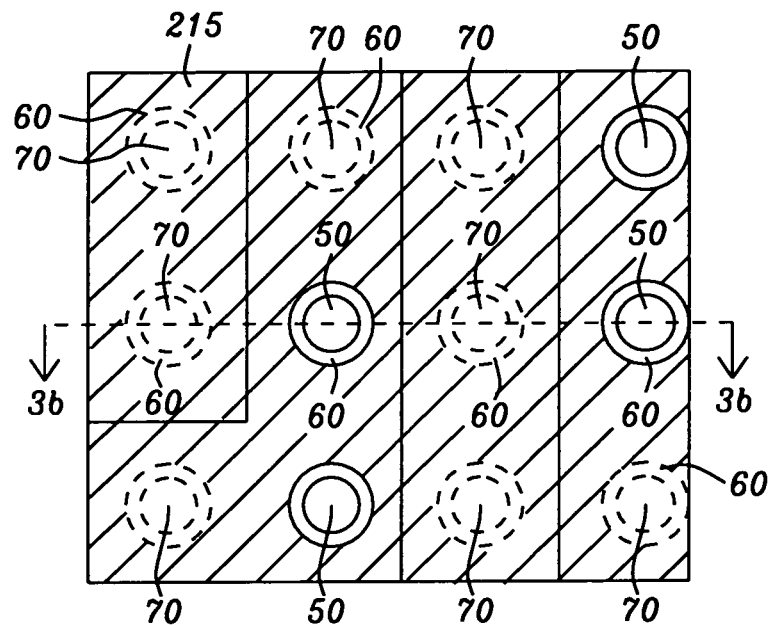
FIG. 3a and FIG. 3b are schematic illustrations of an overhead and side view of an alternative prior art CMOS/device layer interface showing the effect of dummy devices and buffer layer constructions.
Figure 3B:
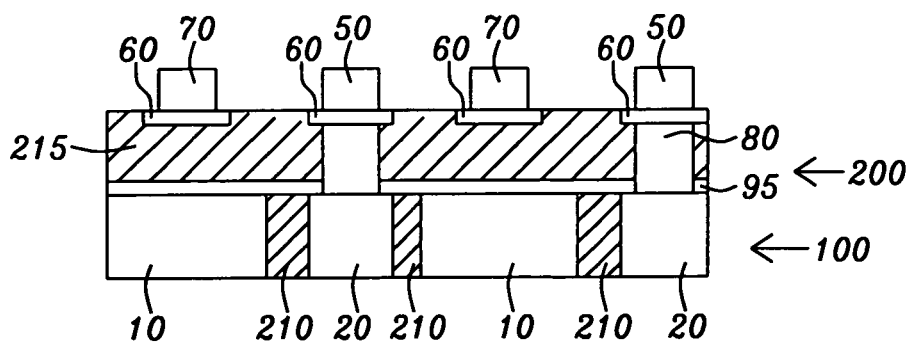
Figure 4A:
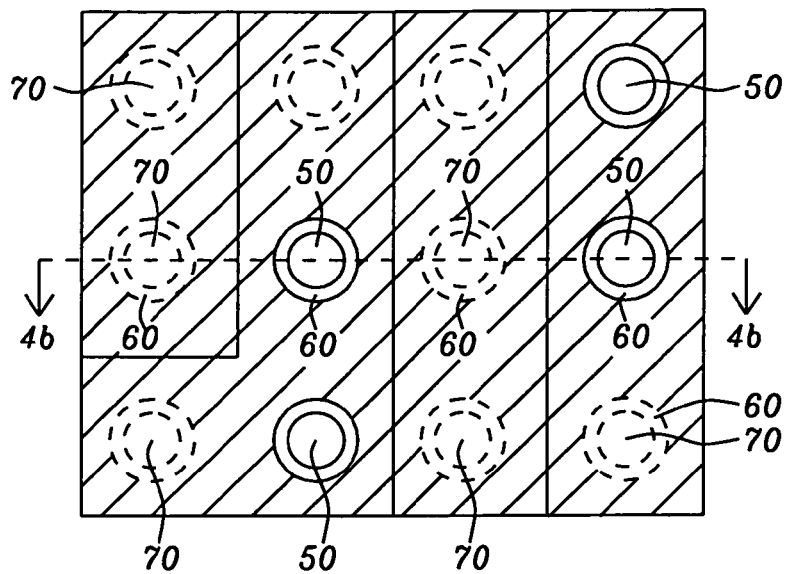
FIG. 4a, FIG. 4b and FIG. 4c are schematic illustrations of a common overhead (4a) and two side views (4b) (4c) of two embodiments of the present invention.

Referring first to FIG. 4a, there is shown a schematic overhead view of a complete fabrication, similar in this overhead view to that in FIG. 3a, but formed in accord with the methods of the present invention. There can be seen the patterned layout of buffer layers (60) formed beneath all device junctions. The array of junctions includes active junction devices (50) and the dummy junction devices (70) (drawn with dashed circular peripheries). The uniform array of active and dummy junctions and vias connecting them to the CMOS level, when formed in the method described below, will provide a super-flat interface between the CMOS and device level and achieve the objects of the present invention.

Figure 4B:
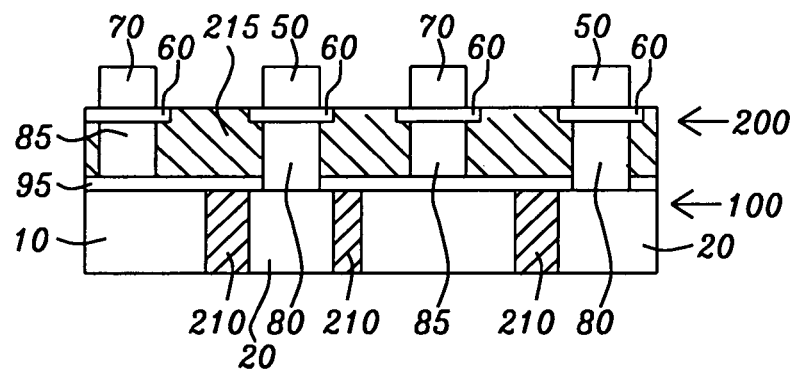

Referring next to FIG. 4b, there is shown a side cross-sectional view taken through line 4b of FIG. 4a to illustrate a first embodiment of the present inventive scheme. The lower CMOS level (100) is capped with an etch-stop layer (95) which is a layer of SiN formed to a thickness between approximately 30 and 150 nm. An upper device level (200), including active (50) and dummy (70) devices, is formed over the CMOS level and separated from it by a dielectric layer (215) that can be a layer of SiO$_2$ formed to a thickness between approximately 50 nm and 500 nm. The CMOS level (100) includes conducting connection pads (20) to which active interconnecting vias (80) are electrically connected. These active vias (80) are filled with conducting material and pass through the etch-stop layer (95) to complete the electrical connection to the connection pads (20). On the upper surface of the fabrication, these vias are covered by buffer layers (60) on which the active devices (50) are formed.

The fabrication also includes dummy vias (85) that are also filled with conducting material, but these dummy vias are not electrically connected to any metal or connection pads in the CMOS layer because they have been stopped by the etch-stop layer (95). The result of this fabrication is that the dummy vias are "dummy" only in the sense that they fail to complete an interconnection with any conducting elements in the CMOS level because they do not penetrate etch stop layer (95), but they function structurally as active vias in that they are filled with conducting material and populate the device level uniformly.

Figure 4C:
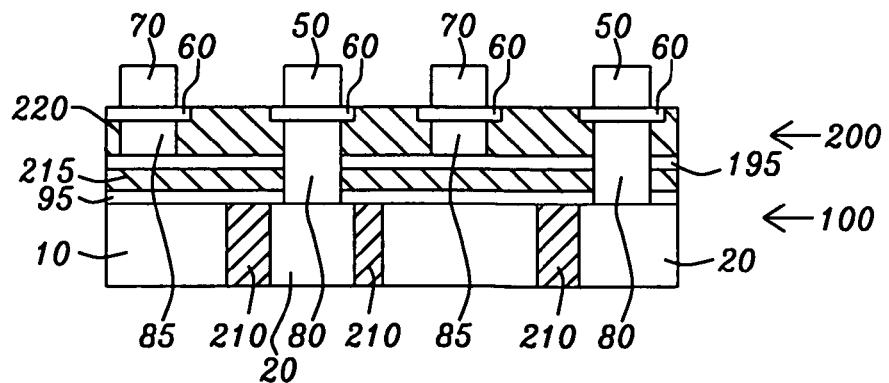

Referring next to FIG. 4c, there is shown an alternative embodiment of the present invention, also fabricating the structure shown in FIG. 4a, but using a different scheme. FIG. 4c shows a cross-section of FIG. 4a taken through line 4b. In FIG. 4c, however, the upper device level (200), which is formed on a first etch-stop layer (95) over CMOS level (100), now includes two dielectric layers (215) and (220), separated from each other by a second etch-stop layer (195). Both dielectric layers can be layers of SiO$_2$ formed to a thickness between approximately 50 and 500 nm in this embodiment and the two etch stop layers can be layers of SiN formed to a thickness between approximately 30 and 150 nm. The dummy vias (85) are stopped at the second etch stop layer, while the active vias (80) pass through both the first and second etch stop layers. It is noted that the thickness of the etch stop layer can determine whether the etch passes through one or both layers.

There are two potential benefits of terminating the dummy vias (85) at the second etch stop layer (195) so that they do not completely parallel the vertical extent of the active vias (80): 1) when two metal layers (80) and (85) are too close together, there may be a capacitance formed between them and resulting RC time delays; 2) the layer separation produced by dielectric layer (215) also minimizes potential electrical short circuits between them.

The following figures, FIGS. 5a-5d and FIGS. 6a-6d will illustrate, respectively, the methods by which the circuit fabrications of FIG. 4b and FIG. 4c can be formed.

Figure 5A:
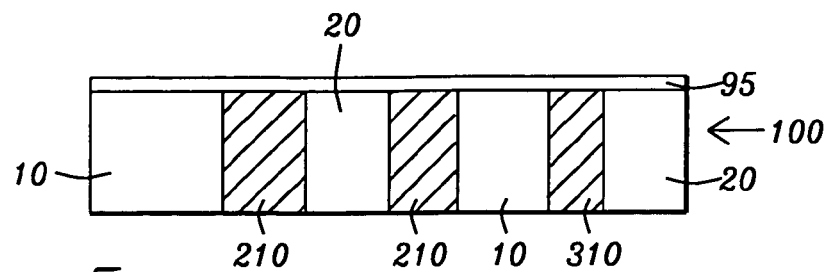
FIG. 5a-FIG. 5d are a sequence of schematic illustrations of a method of fabricating the embodiment of FIG. 4a and FIG. 4b.

Referring to FIG. 5a there is shown schematically a CMOS level (100) on which an etch stop layer (95) has been formed. The etch-stop layer can be a layer of SiN formed to a thickness of between approximately 30 nm and 150 nm. The CMOS level contains dielectric material (210), such as SiO$_2$, various metal connection pads (20) and conducting lines (10) to which connections will ultimately be made to an upper device level yet to be fabricated.

Figure 5B:
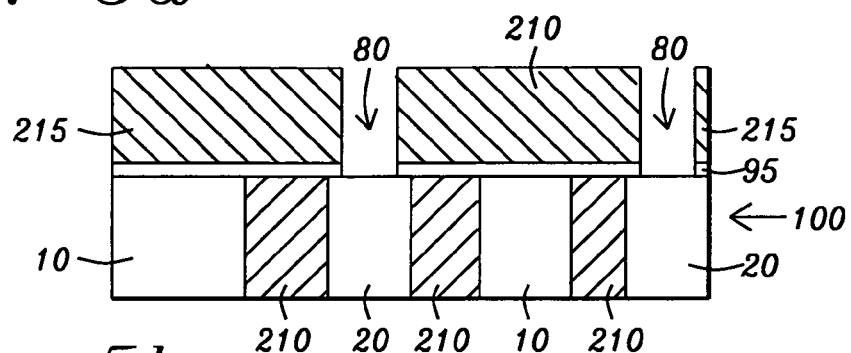

Referring next to schematic FIG. 5b, there is shown the formation of a blanketing dielectric layer (215) over the etch-stop layer (95) on the CMOS level. This dielectric layer can be a layer of SiO$_2$ formed to a thickness between approximately 50 nm and 500 nm. A first pattern and etch process etches via trenches for the active vias (80) through both the dielectric layer (215) and the etch-stop layer (95) to expose the connection pads (20). This first etch is a dry etch.

Figure 5C:
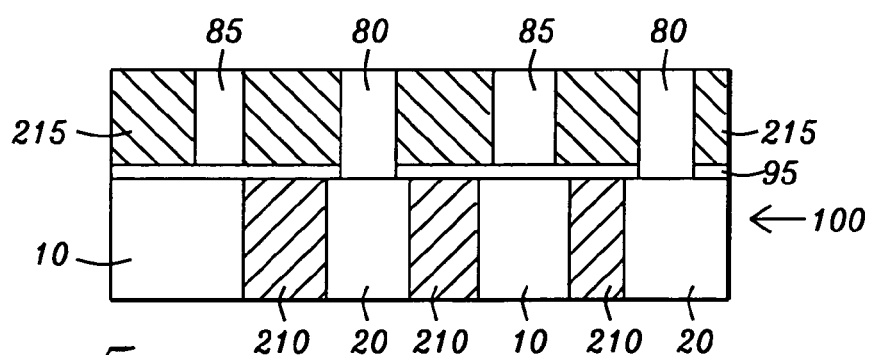

Referring now to FIG. 5c, there is shown a second pattern and etch process that defines the dummy vias (85). This process penetrates the dielectric layer (215), but stops at the etch stop layer (95). After this second etch, the active and dummy via holes are both filled with conductive material. The active via trenches, having exposed the connecting pads, allow the fill of conductive material to electrically contact the connection pads. The layer now has a stiffness and mechanical integrity resulting from the array of filled vias.

Figure 5D:
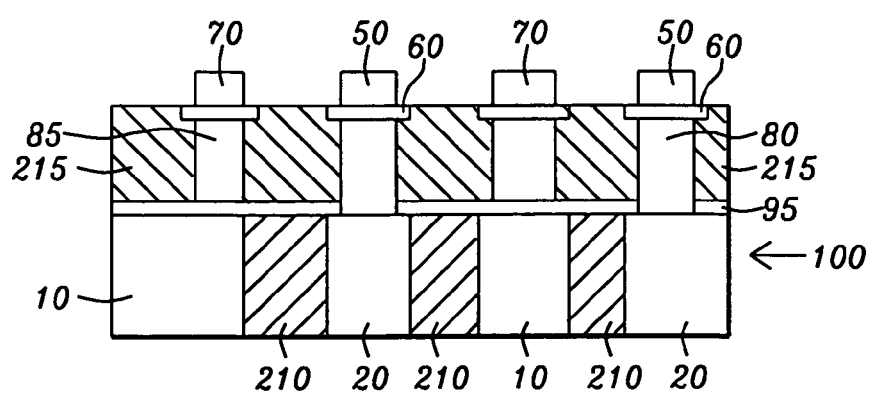

Referring now to FIG. 5d, there is shown schematically that the upper surface of the fabrication of FIG. 5c has been planarized, by a CMP process (chemical mechanical polishing process) to remove any excess conductor from the via fills that might overflow onto the upper surface. Layers of conducting buffer material (60) are now formed over the upper surface of the fabrication. These layers are normally formed by first depositing a completely covering metal layer, then patterning the layer to surround the vias using a photo/etching process and filling the spaces between the resulting strips of buffer with a dielectric layer which is then planarized. Finally, active (50) and dummy (70) memory junction devices are formed over the patterned buffer material that covers each via. We will not describe the processes by which the junction devices are fabricated as they are known in the art.

Figure 6A:
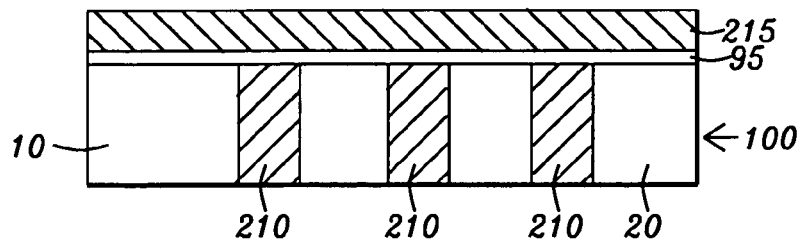
FIG. 6a-FIG. 6d are a sequence of schematic views of a method of fabricating the embodiment of FIG. 4a and FIG. 4c.

Referring now to FIG. 6a, there is shown the first process step in the formation of the fabrication illustrated in FIG. 4c. Exactly as in FIG. 5a there is shown a CMOS level (100) covered with a first etch-stop layer (95). Now, however, unlike FIG. 5a, a first blanket dielectric layer (215) is formed on the first etch-stop layer. As in FIG. 5a, the first etch-stop layer is a layer of SiN formed to a thickness of between 30 and 150 nm. The first blanket dielectric layer is a layer of $SiO_2$ formed to a thickness between approximately 30 and 150 nm.

Figure 6B:
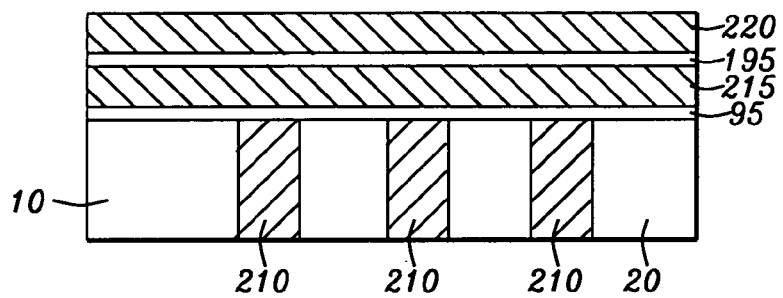

Referring next to FIG. 6b, there is shown schematically the fabrication of FIG. 6a where a second etch-stop layer (195) has been formed over the first dielectric layer (215) and a second dielectric layer (220) is formed over the second etch-stop layer. These layers are substantially identical with the first etch stop and blanket dielectric layers.

Figure 6C:
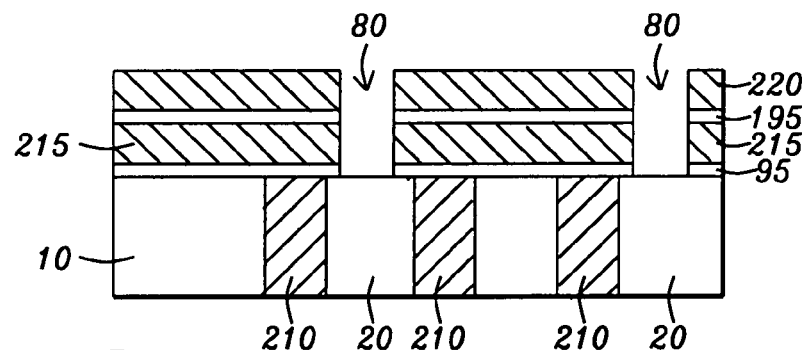

Referring next to FIG. 6c, there is shown schematically the fabrication of FIG. 6b wherein a first pattern and etch process creates via trenches (80) that pass through both dielectric layers (220), (215) and both etch-stop layers (195), (95) and form openings to expose connecting pads (20) in the CMOS level. This is a dry etch process that is known in the art.

Figure 6D:
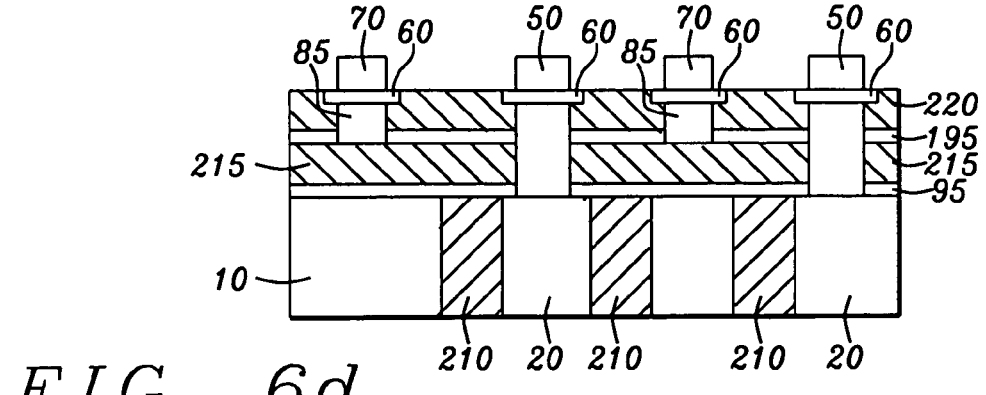

Referring next to FIG. 6d, there is shown schematically the fabrication of FIG. 6c where a second pattern and etch process forms openings for the dummy vias (85) by passing through only the second dielectric layer (220) and stopping at (or passing through) the second etch-stop layer (195). The etched openings of both active and dummy vias are now filled with a conducting material. The conducting material in the active via trenches electrically contacts the connecting pads.

It has already been noted that there are two benefits of only filling the dummy vias up to the second etch stop layer (195): 1) the problem of capacitance between the two metal vias is reduced and 2) the problem of possible shorting between the two metal vias is reduced.

The fabrication is then planarized, by a CMP process (chemical mechanical process) on the surface of the second dielectric layer to remove any excess conductor overflowing from the via fills. A layer of conducting buffer material (60) is formed over the entire fabrication. A pattern and etch process defines buffer layer strips (60) and a dielectric layer refills the spaces between the strips. The resulting fabrication is then planarized. Finally, memory junction devices are formed over the buffer layer covering each via. Devices (50) are active and are conductively connected to the CMOS layer. Devices (70) are dummy and do not connect to the CMOS level. We will not describe the processes by which the junction devices are fabricated as they are known in the art.

As is finally understood by a person skilled in the art, the preferred embodiments of the present invention are illustrative of the present invention rather than limiting of the present invention. Revisions and modifications may be made to methods, materials, structures and dimensions employed in integrating a CMOS level with an active device level, while still forming and providing such an integrated device and its method of formation in accord with the spirit and scope of the present invention as defined by the appended claims.

What is claimed is:

1. An integrated circuit comprising:
    a CMOS level including conducting connection pads for forming electrical connections thereto;
    a device level including a uniform horizontal array of identical devices having electrical contacts thereto;
    a passive interconnect level formed between said CMOS level and said device level wherein said passive interconnect level has an upper surface that is adjacent to and contacts said device level and a lower surface that is adjacent to and contacts said CMOS level and wherein said passive interconnect level contains two arrays of vias, the first array being an array of active vias each of which pass continuously from said upper surface to said lower surface and form an electrically conducting path between said two surfaces; wherein each active via has an electrically contacting portion on said upper surface of said passive interconnect level that forms an electrically conductive connection to one of said electrical contacts of said device level and wherein each said active via also has an electrically contacting portion on said lower surface of said passive interconnect level that forms an electrically conductive connection to one of said conducting connection pads of said CMOS level, whereby each said active via electrically connects one device conducting pad of said device level to one conducting connection pad of said CMOS level, and wherein
    said second array of vias is an array of dummy vias, wherein each of said dummy vias has an electrically contacting portion on said upper surface of said passive interconnect level that forms an electrically conductive connection to one of said electrical contacts of said device level but wherein each said dummy via terminates within said passive interconnect level and does not extend to said lower surface and does not make electrical contact to any of said conducting connection pads of said CMOS level; wherein
    said electrically contacting portion of each of said active vias and said electrically contacting portion of each of said dummy vias are identical structures and form a uniform regular array of identical structures horizontally disposed on said upper surface of said passive interconnect level and wherein each of said electrical contacts of said device level is contacted by one of said electrically contacting portions and wherein each of said electrically contacting portions contacts one of said electrical contacts of said device level;
    whereby said upper surface of said passive interconnect level is rendered flat and free of warpage by virtue of its geometric and structural uniformity
    and whereby
    said device level is thereby formed on a flat surface.

2. The circuit of claim 1 wherein a small, uniformly patterned layer of buffer material is interposed between each active device and active via and each dummy device and each dummy via thereby enhancing the uniformity of the distribution of vias.

3. The circuit of claim 1 wherein said devices are MRAM memory junctions.

4. The integrated circuit of claim 1 wherein said interconnect level further comprises:
    an etch stop layer contacting said CMOS level;
    a first dielectric layer formed on said etch stop layer;
    a second etch stop layer formed on said first dielectric layer;
    a second dielectric layer formed on said second etch stop layer; wherein
    said active vias penetrate said two layers of dielectric material and said two etch stop layers; and
    said dummy vias penetrate said second dielectric layer and terminate at said second etch-stop layer.

* * * * *